(12) United States Patent
Park et al.

(10) Patent No.: US 8,958,205 B2
(45) Date of Patent: Feb. 17, 2015

(54) COVER OPENING/CLOSING APPARATUS FOR PORTABLE COMMUNICATION DEVICE

(75) Inventors: Jae-Hong Park, Gyeongsangbuk-do (KR); Young-Suk Kim, Gyeonggi-do (KR); Jung-Hee Go, Gyeongsangbuk-do (KR); Byung-Hun Cho, Gyeongsangbuk-do (KR); Seung-Ha Lee, Daegu (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 611 days.

(21) Appl. No.: 12/915,184

(22) Filed: Oct. 29, 2010

(65) Prior Publication Data
US 2011/0157791 A1    Jun. 30, 2011

(30) Foreign Application Priority Data
Dec. 30, 2009  (KR) ........................ 10-2009-0134821

(51) Int. Cl.
*H05K 5/02* (2006.01)
*H04M 1/02* (2006.01)
*G06F 1/16* (2006.01)

(52) U.S. Cl.
CPC ........... *H04M 1/0274* (2013.01); *H05K 5/0221* (2013.01); *G06F 1/1656* (2013.01); *H04M 1/0202* (2013.01)
USPC ............... 361/679.58; 455/575.1; 379/433.11

(58) Field of Classification Search
CPC ........... H05K 2201/083; H05K 5/061; H05K 5/0221; H05K 5/00; H05K 5/0004; G06F 1/1613; G06F 1/1656; G06F 1/1601; G06F 1/1637; G06F 2200/1633; G06F 1/1628; G06F 1/1616; G06F 1/1679; G06F 1/1677
USPC ............. 361/679.01, 679.02, 679.55, 679.56, 361/679.57, 679.58, 679.3; 455/575.1–575.4; 379/433.11–433.13
See application file for complete search history.

(56) References Cited

U.S. PATENT DOCUMENTS

| | | | | |
|---|---|---|---|---|
| 5,091,823 | A * | 2/1992 | Kanbara et al. | 361/697 |
| 5,130,892 | A * | 7/1992 | Satou | 361/679.55 |
| 5,685,469 | A * | 11/1997 | Stapleton | 224/505 |
| 5,769,159 | A * | 6/1998 | Yun | 165/276 |

(Continued)

FOREIGN PATENT DOCUMENTS

| | | | | |
|---|---|---|---|---|
| KR | 2004-94542 | 11/2004 | | H04B 1/38 |
| KR | 2006-4224 | 1/2006 | | H04B 1/38 |
| KR | 2007-120227 | 12/2007 | | H01R 13/508 |

*Primary Examiner* — Anthony Haughton
*Assistant Examiner* — Ingrid Wright
(74) *Attorney, Agent, or Firm* — Cha & Reiter, LLC

(57) ABSTRACT

Disclosed is a cover system for a portable communication device which is latched or separated according to pulling or pushing a cover unit so as to open/close a slot entrance of a portable communication device. The cover opening/closing apparatus includes a slot entrance formed on a body of the portable communication device; a cover unit for opening/closing the slot entrance, the cover unit being assembled with the slot entrance and latched to or separated from the slot entrance according to pulling or pushing the cover unit; a plurality of assembly units formed on the slot entrance; and a plurality of latching units formed on the cover unit, assembled to be inserted into and withdrawn from the assembly units, and latched to or separated from the assembly units according to pulling and pushing or lifting the cover unit.

3 Claims, 12 Drawing Sheets

(56) References Cited

U.S. PATENT DOCUMENTS

| | | | |
|---|---|---|---|
| 5,935,729 A * | 8/1999 | Mareno et al. | 429/100 |
| 7,307,846 B2 * | 12/2007 | Du | 361/728 |
| 2006/0131140 A1 * | 6/2006 | Oh | 200/4 |
| 2007/0091582 A1 * | 4/2007 | Ku et al. | 361/814 |
| 2008/0179895 A1 * | 7/2008 | Lin | 292/116 |
| 2008/0210724 A1 * | 9/2008 | Geis et al. | 224/217 |
| 2010/0117384 A1 * | 5/2010 | Cole et al. | 292/341.17 |

* cited by examiner

COVER OPENING/CLOSING APPARATUS FOR PORTABLE COMMUNICATION DEVICE

CLAIM OF PRIORITY

This application claims priority under 35 U.S.C. §119(a) to a Korean Patent Application entitled "Cover Opening/Closing Apparatus for Portable Communication Device" filed in the Korean Intellectual Property Office on Dec. 30, 2009 and assigned Serial No. 10-2009-0134821, the contents of which are incorporated herein by reference.

BACKGROUND OF THE INVENTION

1. Field of the Invention

The present invention relates to a cover for a portable communication device which is latched or separated according to pulling or pushing of a cover unit so as to open/close a slot entrance of a portable communication device.

2. Description of the Related Art

In general, a portable communication device enables a user to wirelessly communicate with a counterpart. An example of the wireless functions includes a voice call, sending a message, sending a file, video call, a camera function, or the like. Further, the portable communication device serves as a personal assistance by way managing telephone numbers or a personal schedule.

Taking the portability into consideration, the portable communication device has to be compact, slim, easy to grip, and light. Today, it is being developed with emphasis in providing multimedia services, e.g. entertainment contents including games. In the future, the portable communication device is expected to be a multifunctional complex device including a function of video call, games, Internet service, and camera, as well as the traditional voice call service.

The portable communication device includes a slot for connecting an IF connector or memory at a predetermined external location of the body. In particular, the predetermined location of the body generally corresponds to a lateral surface, lower surface, or bottom surface of the body. A conventional cover opening/closing apparatus mounted on an entrance of the slot is illustrated in FIGS. 1 and 2.

As illustrated in FIGS. 1 and 2, in the conventional cover opening/closing apparatus 1, a cover 3 is rotatably mounted on a slot entrance 2 of a body so that the slot entrance 2 is opened/closed according to the rotation of the cover 3. The cover 3 includes a cover body 3a and an assembly part 3b vertically extending from the cover body 3a.

The assembly part 3b is forcefully fitted to an assembly hole 2a of the slot entrance 2 of the body. The cover body 3a and assembly part 3b are made of a soft material. If the user slightly pulls the cover body 3a from the slot entrance 2, the cover body 3a rotates about the assembly part 3b at a predetermined angle so that the entrance 2 is exposed. FIG. 2 illustrates the state where the cover body 3a rotates and the entrance 2 is opened. In this state, the user inserts a connector inside of the entrance so that the connector is connected with the body.

However, according to the conventional cover opening/closing apparatus, the cover is pulled and rotated to operate so that such an opening/closing action is cumbersome for the user.

Further, if the cover is repeatedly opened/closed over time period, fatigue is incurred in the assembly part of the cover so that the cover may be fall apart permanently or damaged.

Furthermore, the cover protrudes when opened which in turn create interference with the connector and degrades the external appearance of the communication device.

In order to address the above problems, a hook-type cover a dual injection structure and a sliding-type cover have been developed. However, there is a disadvantage in that the number of constructional elements of these type of cover increases, thereby increasing the assembly process efforts and manufacturing cost.

Therefore, an improved cover that is fatigue and damage proof while aesthetically pleasing are needed.

SUMMARY OF THE INVENTION

Accordingly, the present invention has been made to solve the above-stated problems occurring in the prior art and provides additional advantages, by providing a cover for a portable communication device that is latched or separated according to pulling and pushing a cover unit to open/close a slot entrance of the portable communication device.

Another aspect of the present invention is to provide a cover system for a portable communication device in which locks the cover unit according to the pressing the cover unit and slides to open/close the slot entrance of the portable communication device via elastic force, thus simplifying easy opening/closing action of the cover unit.

Another aspect of the present invention is to provide a cover system for a portable communication device in which the slot entrance of the portable communication device is selectively opened/closed according to a magnetic force of the cover unit so that it can make facilitate easy opening/closing action of the cover unit while reducing the number of the constructional components to shorten the manufacturing time and cost.

Another aspect of the present invention is to provide a cover system for a portable communication device in which the cover unit semi-automatically slides by an elastic member to open/close the slot entrance of the portable communication device.

In accordance with an aspect of the present invention, a cover system for a portable communication device includes: a slot entrance formed on a body of the portable communication device; a cover unit for opening/closing the slot entrance, the cover unit being assembled with the slot entrance and latched to or separated from the slot entrance according to pulling or pushing the cover unit; a plurality of assembly units formed on the slot entrance; and a plurality of latching units formed on the cover unit, assembled to be inserted into and withdrawn from the assembly units, and latched to or separated from the assembly units according to pulling and pushing or lifting the cover unit.

In accordance with another aspect of the present invention, a cover system for a portable communication device includes: a slot entrance formed on a body of the portable communication device; a cover unit moving by elastic force to open/close the slot entrance, the cover unit being slidably assembled with the slot entrance and attached to/detached from the slot entrance according to pressing the cover unit; a sliding locking unit for locking the cover unit according to pressing the cover unit and slidably moving the cover unit by elastic force, the sliding locking unit being formed on the slot entrance and the cover unit.

In accordance with another aspect of the present invention, a cover system for a portable communication device includes: a slot entrance formed on a body of the portable communication device; a first magnet formed on a location adjacent to the slot entrance; and a cover unit including a second magnet slidably assembled with the slot entrance to open/close the slot entrance by magnetic force of the first magnet when sliding.

In accordance with another aspect of the present invention, there is provided a slot entrance formed on a body of the portable communication device; a cover unit semi-automatically moving by elastic force to open/close the slot entrance, the cover unit being slidably assembled with the slot entrance; and an elastic member formed between the body and the cover unit to provide elastic force so as to semi-automatically slide the cover unit.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE INVENTION

Figure 1:
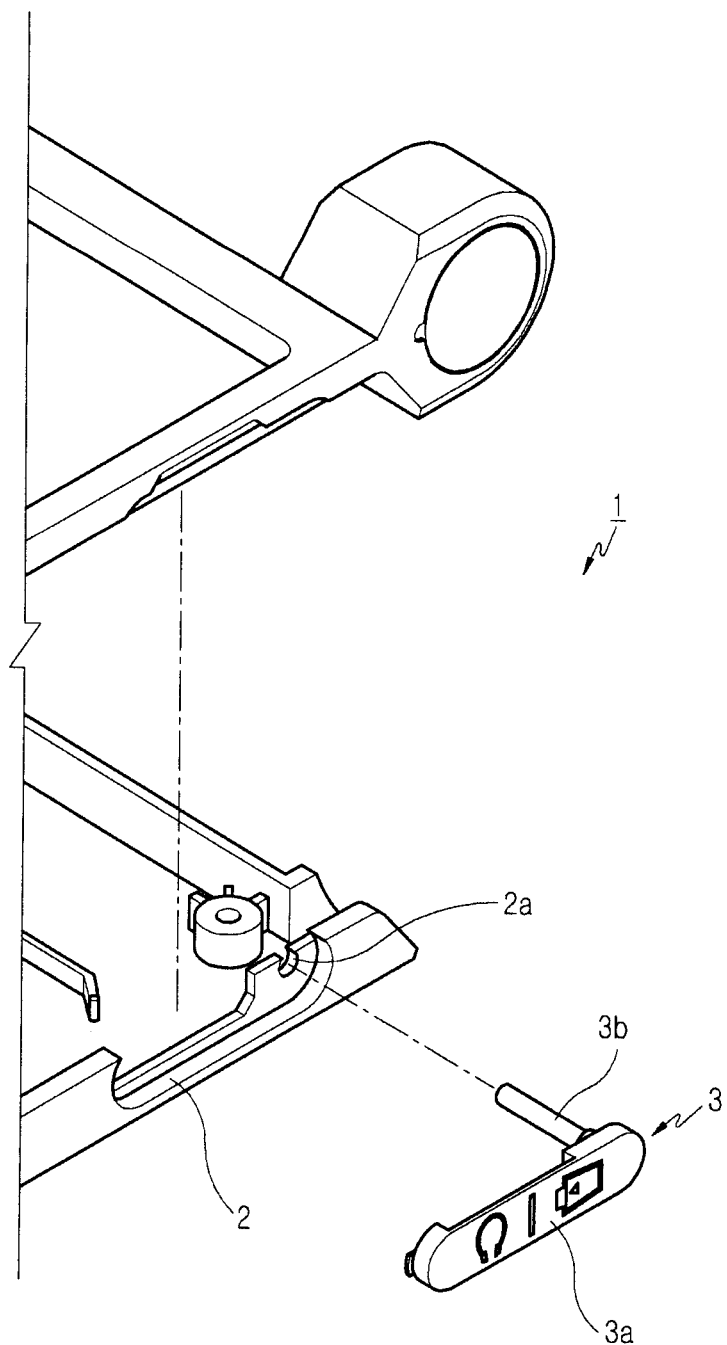
FIG. 1 is an exploded perspective view illustrating the construction of a conventional cover system for a portable communication device.
Figure 2:
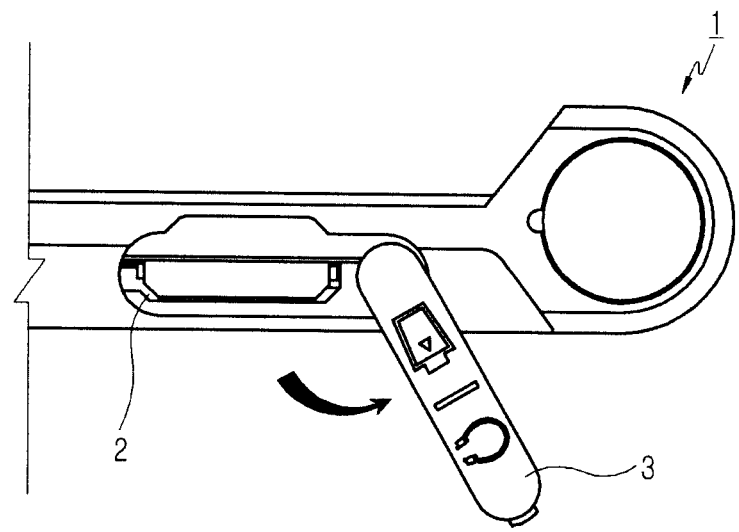
FIG. 2 is a side view illustrating an operation state of a conventional cover system for a portable communication device.
Figure 3:
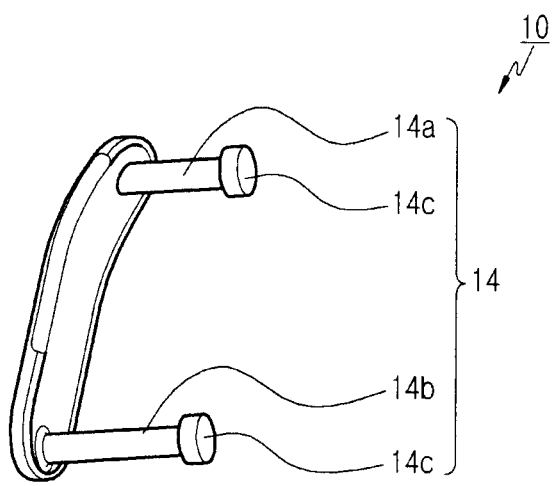
FIG. 3 is a perspective view illustrating a cover unit in the construction of a cover system for a portable communication device according to a first embodiment of the present invention.
Figure 4:
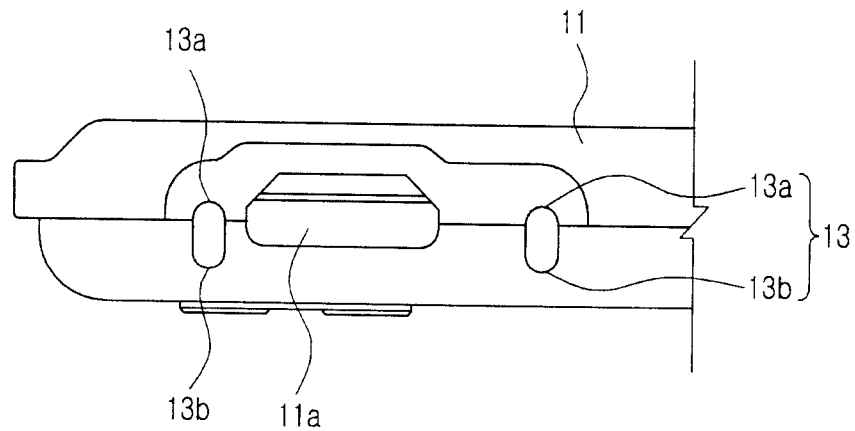
FIG. 4 is a side view illustrating a slot entrance in the construction of a cover system for a portable communication device according to a first embodiment of the present invention.

Hereinafter, the exemplary embodiments of the present invention will be described with reference to the accompanying drawings. For the purposes of clarity and simplicity, detailed explanation of known related functions and constitutions may be omitted to avoid unnecessarily obscuring the subject matter of the present invention.

As illustrated in FIGS. 3 to 12, a cover system 10 for a portable communication device includes a body 11 of the portable communication device, a slot entrance 11a, a cover unit 12, a plurality of assembly units 13, and a plurality of latching units 14. The slot entrance 11a is formed on the body 11 and assembled with the cover unit 12. The cover unit 12 is assembled with the slot entrance 11a and is latched or separated according to pulling and pushing the cover unit 12 so as to selectively open/close the slot entrance 11a. The plurality of assembly units 13 are formed on the slot entrance 11a and assembled with the plurality of latching units 14 so that the plurality of latching units 14 can be inserted to or withdrawn from the assembly units 13. The plurality of latching units 14 are assembled with the plurality of assembly units 13 to be inserted/withdrawn and are formed on the cover unit 12 so that they are latched or separated from the assembly unit 13 according to pulling and pushing or lifting of the cover unit 12.

As illustrated in FIGS. 3 to 10, the assembly unit 13 includes a first assembly groove 13a and a second assembly groove 13b. The first assembly groove 13a is formed on the slot entrance 11a for movably receiving the latching units 14. The second assembly groove 13b is formed in a location adjacent to the slot entrance 11a so that when the cover unit 12 is pulled and pressed or lifted therefrom, the second assembly groove 13b is forcefully fitted into the latching units 14 to be latched and fixed or separated therefrom.

Note that the second assembly groove 13b may have a size smaller than the first assembly groove 13a for forcefully fitting with the latching unit 14.

With continued references to FIGS. 3 to 10, the latching units 14 include a first latching unit 14a and a second latching unit 14b. The first latching unit 14a is formed at one end of the cover unit 12 to be engaged with the first and second assembly grooves 13a and 13b. the second latching unit 14b is formed at the other end of the cover unit 12 to be engaged with the first and second assembly grooves 13a and 13b.

An anti-separation jaw 14c is formed at both ends of the first and second latching units 14a and 14b, respectively, for preventing the first and second latching units 14a and 14b being separated from the first and second assembly grooves 13a and 13b.

Figure 11:
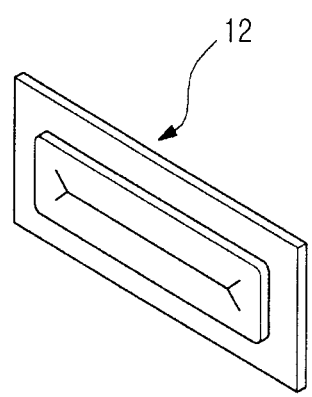
FIG. 11 is a perspective view illustrating another example of a cover unit in a cover system for a portable communication device according to a first embodiment of the present invention.
Figure 12:
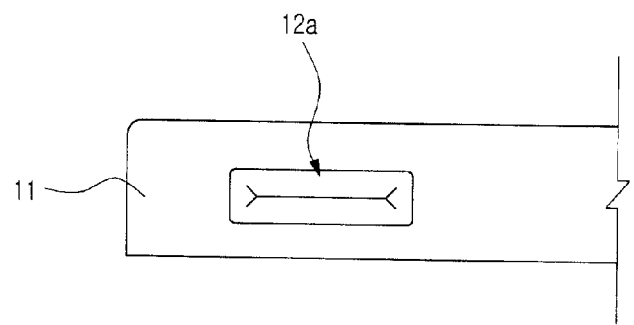
FIG. 12 is a side view illustrating another example of a cover system for a portable communication device according to a first embodiment of the present invention, which illustrates an assembly state of a cover unit with the portable communication device.

FIGS. 11 and 12 illustrate another example of the cover unit 12a. The cover unit 12a is made of shape memory alloy or rubber materials in order to generate a substantially tight seal according to the contact with the cover unit 12 and open/close the slot entrance 11a when an external connection terminal (not shown) is inserted into or separated from the cover unit 12a. Note that other materials except for the shape memory alloy or rubber materials can be used.

It should be noted that the teachings of the present invention may be applicable to a flip-type, a folder-type, a bar-type, and a sliding-type device, and other portable device type known to those skilled in the art. The portable communication device of the present invention is not definitely limited to the mobile communication terminal and can be applied to various types of portable communication devices. For example, the portable communication device according to the present invention may includes any mobile communication terminal or duplex systems operated based on communication protocols corresponding to various communication systems, information communication devices, such as a PMP (Portable Multimedia Player), MP3 player, digital broadcasting player, PDA (Personal Digital Assistant), and smart phone, and its related application device.

Hereinafter, the operation of the cover opening/closing apparatus for the portable communication device having the above construction according to the first embodiment of the present invention will be described with reference to FIGS. 3 to 10 in more detail.

In operation, the first and second latching units 14a and 14b are closely assembled with the first assembly groove 13a. In this state, as shown in FIGS. 6 to 10, if the user opens the cover unit 12 from the slot entrance 11a by a sequence movement of grapping, pulling and sliding the cover unit 12. The first and second latching units 14a and 14b of the cover unit 12 slides with respect to and is withdrawn from the first assembly groove 13a. Thereafter, if the cover unit 12 is downwardly pressed, the first and second latching units 14a and 14b are forcefully fitted into the second assembly groove 13b to be latched and fixed thereto.

The opening of the second assembly groove 13b is smaller than the first assembly groove 13a so that the first and second latching units 14a and 14b can be forcefully or tightly fitted into the second assembly groove 13b after sliding with respect to the first assembly groove 13a.

At this time, the first and second latching units 14a and 14b include the anti-separation jaw 14c at both ends thereof so that the anti-separation jaw 14c limits the sliding of the first and second latching units 14a and 14b by preventing the first and second latching units 14a and 14b from being separated from the body 11.

As a result, the cover unit 12 reveals the slot entrance 11a. The outside connection terminal (not shown) is inserted to the opened slot entrance 11a to be electrically connected.

Figure 5:
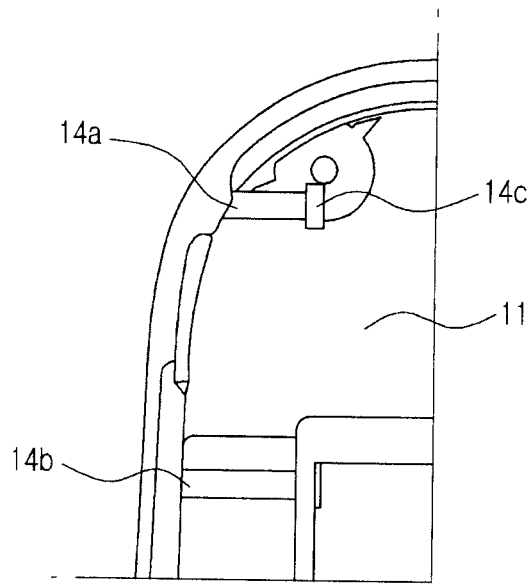
FIG. 5 is a plan view illustrating an assembly state of a cover system for a portable communication device according to a first embodiment of the present invention.
Figure 6:
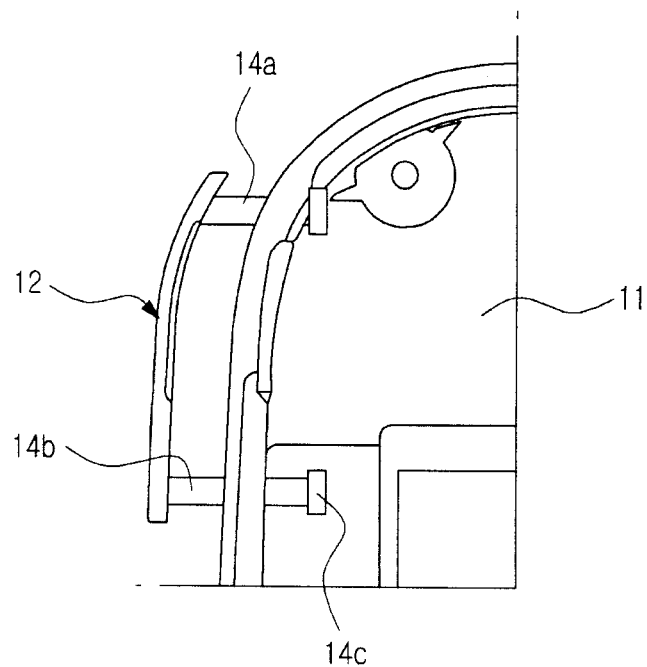
FIG. 6 is a plan view illustrating an operation procedure of a cover system for a portable communication device according to a first embodiment of the present invention.
Figure 7:
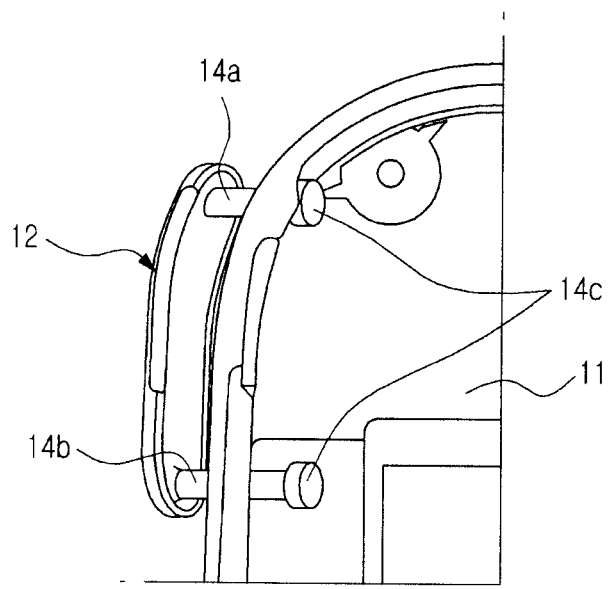
FIG. 7 is a plan view illustrating a state after the operation of a cover system for a portable communication device according to a first embodiment of the present invention.
Figure 8:
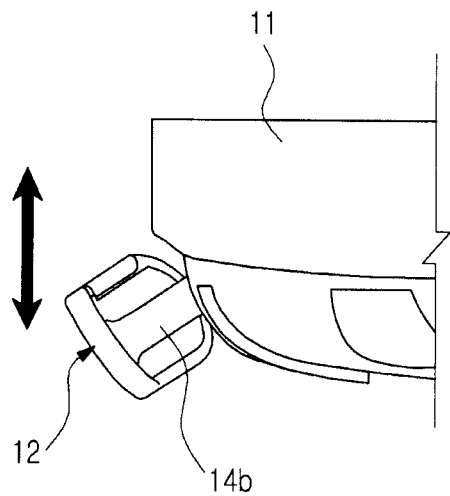
FIG. 8 is an elevational view illustrating a state after the operation of a cover system for a portable communication device according to a first embodiment of the present invention.
Figure 9:
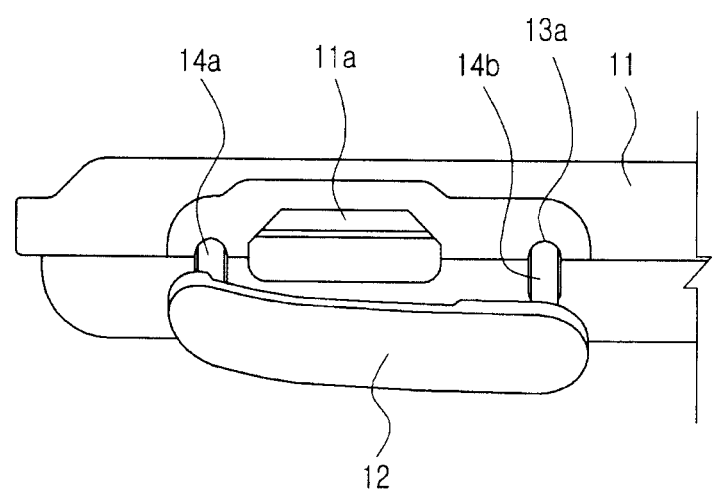
FIG. 9 is a side view illustrating a state after the operation of a cover system for a portable communication device according to a first embodiment of the present invention.
Figure 10:
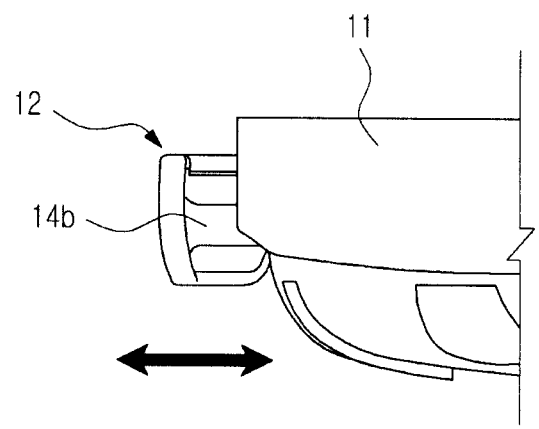
FIG. 10 is an elevational view illustrating an operation procedure of a cover system for a portable communication device according to a first embodiment of the present invention.

With reference to FIGS. 5 and 10, if the user closes the slot entrance 11a by upwardly lifting the cover 12, the first and second latching units 14a and 14b are separated or snapped away from the second assembly groove 13b and then can be guided towards the first assembly groove 13a. Here, the cover unit 12 slides toward the slot entrance 11a, and the first and second latching units 14a and 14b are inserted into the first assembly groove 13a. Accordingly, the cover unit 12 closes the slot entrance 11a.

Hereinafter, the operation of inventive cover system for the portable communication device according to a second embodiment of the present invention will be described with reference to FIGS. 13 to 16.

As shown in FIGS. 13 to 16, a cover system 20 according to the second embodiment includes a body 21 of the portable communication device, a slot entrance 21a formed on the body 21, a cover unit 22, and a sliding locking unit 23. The slot entrance 21a is formed on the body and is assembled with the cover unit 22 to be opened/closed.

The cover unit 22 is slidably assembled with the slot entrance 21a so that the cover unit 22 when pressed or released can selectively open and closed to expose the slot entrance 21a via an elastic force.

The sliding locking unit 23 is formed in the slot entrance 21a and the cover unit 22, so that the cover unit 22 can be locked by the elastic force.

The body 21 includes a movement part 21b includes a movement groove for slidably receiving the cover unit 22 when activated.

The sliding locking unit 23 includes a latching part 23a, an attachment/detachment locker 23b, and an elastic member 23c. The latching part 23a is formed at the cover unit 22 to be attached to and detached from the attachment/detachment locker 23b.

The attachment/detachment locker 23b is provided to be engaged with o the latching part 23a. Further, the attachment/detachment locker 23b is provided within the slot entrance 21a so that the attachment/detachment locker 23b is attached to and detached from the latching part 23a via elastic force when pressing/activation of a stopper knob 22a occurs.

The elastic member 23c is formed on the body 21 so as to provide the elastic force for sliding the cover unit 22.

The cover unit 22 includes the stopper knob 22a that is exposed to the outside and limits the sliding of the cover unit 22 at one end thereof, the attachment/detachment locker 23b that is latched to or separated from the latching part 23a is formed in a rear side thereof, and at least one supporting protrusion 22b is formed at the other end of the cover unit 22 and assembled with the elastic member 23c to support the elastic member 23c.

The attachment/detachment locker 23b and the latching part 23a are shaped like a hemisphere.

Figure 15:
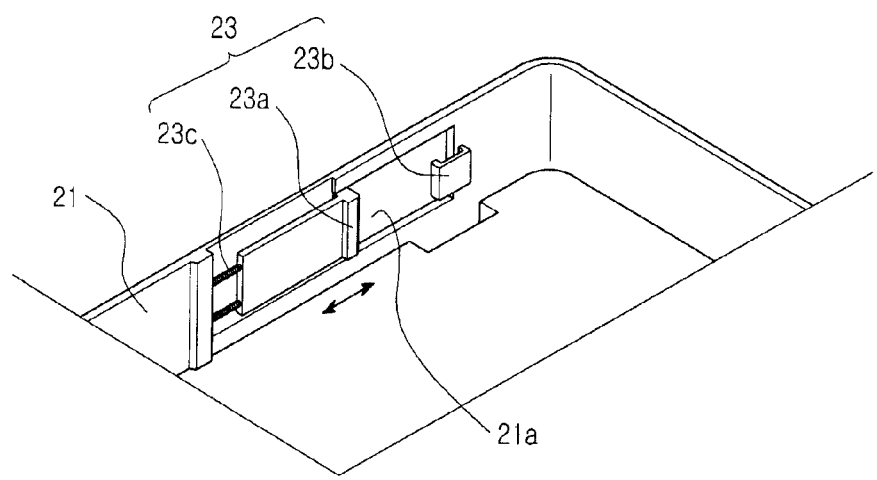
FIG. 15 is a perspective view illustrating an operation state of a cover system for a portable communication device according to a second embodiment of the present invention.
Figure 16:
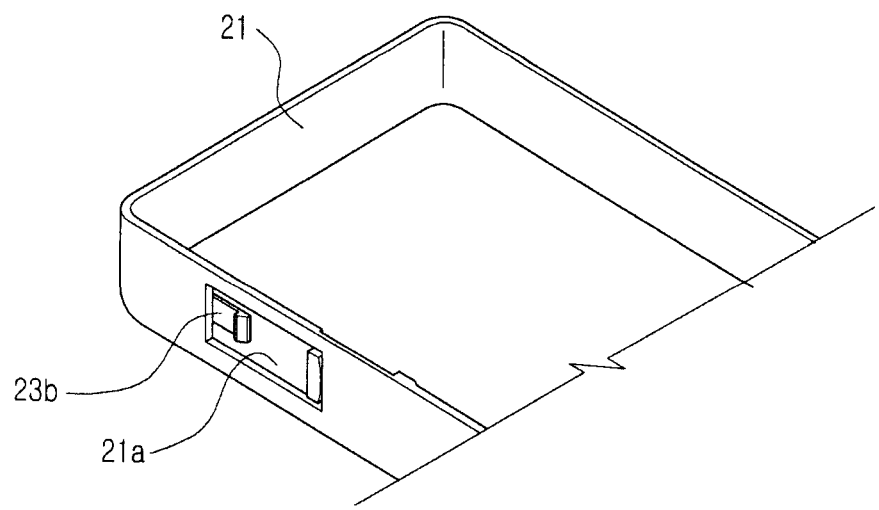
FIG. 16 is a perspective view illustrating an opening state of a cover unit in the construction of a cover system for a portable communication device according to a second embodiment of the present invention.

In this state, as shown in FIGS. 15 and 16, if the user wishes to open the cover unit 22 from the slot entrance 21a, the user first presses the stopper knob 22a formed on the cover unit 22. The stopper knob 22a is pressed together with the attachment/detachment locker 23b which in turn causes the attachment/detachment locker 23b to be separated from the latching unit 23a.

If the attachment/detachment locker 23b is pressed, the latching unit 23a is pressed together with the attachment/detachment locker 23b and is separated from the attachment/detachment locker 23b.

At this time, the cover unit 22 is pulled by the elastic force of the tensioned elastic member 23c to slide down. The sliding of the cover unit 22 is limited by the stopper knob 22a so that the slot entrance 21a remains open. The stopper knob 22a is in contact with one end of the slot entrance 21a to limit the sliding of the cover unit 22.

Figure 13:
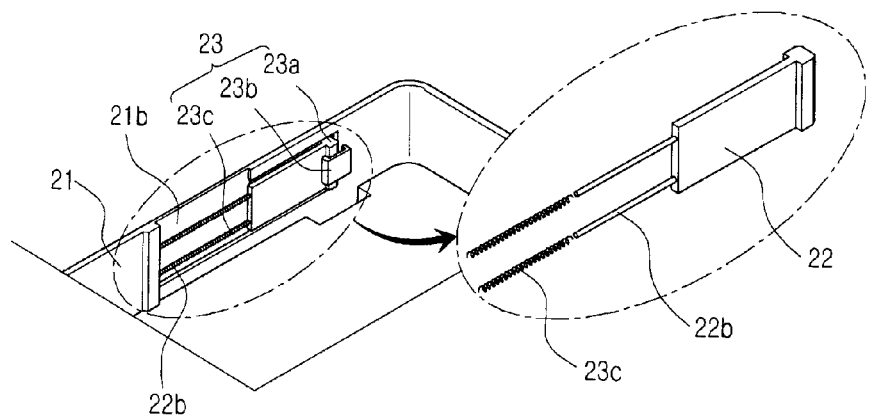
FIG. 13 is a perspective view illustrating the construction of a cover system for a portable communication device according to a second embodiment of the present invention.
Figure 14:
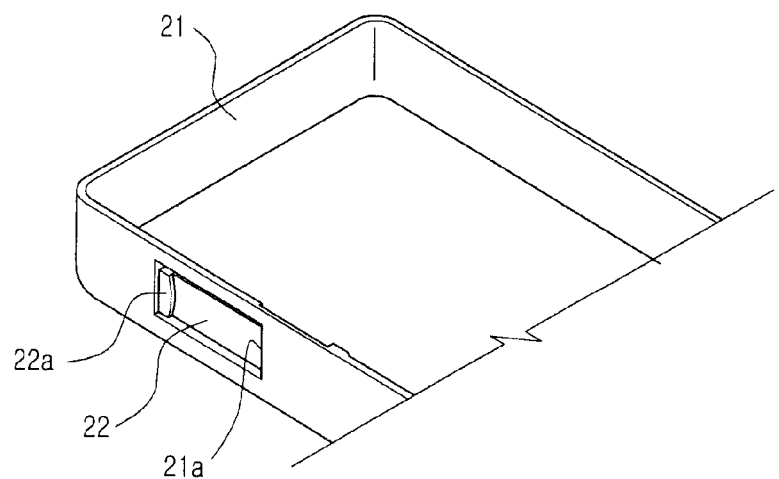
FIG. 14 is a perspective view illustrating an assembly state of a cover system for a portable communication device according to a second embodiment of the present invention.

Here, as shown in FIGS. 13 and 14, if the user slides the stopper knob 22a of the cover unit 22 so as to close the slot entrance 21a, the attachment/detachment locker 23b of the cover unit 22 also slides to be latched and fixed to the latching unit 23a of the body 21. At this time, the elastic member 23c also slides and is tensioned, and the cover unit 22 closes the slot entrance 21a.

Hereinafter, the operation of a cover system for the portable communication device according to a third embodiment of the present invention will be described with reference to FIGS. 17 to 19 in more detail.

Figure 17:
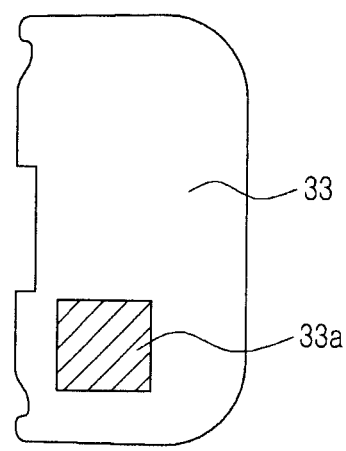
FIG. 17 is a plan view illustrating a cover unit in a construction of a cover system for a portable communication device according to a third embodiment of the present invention.
Figure 18:
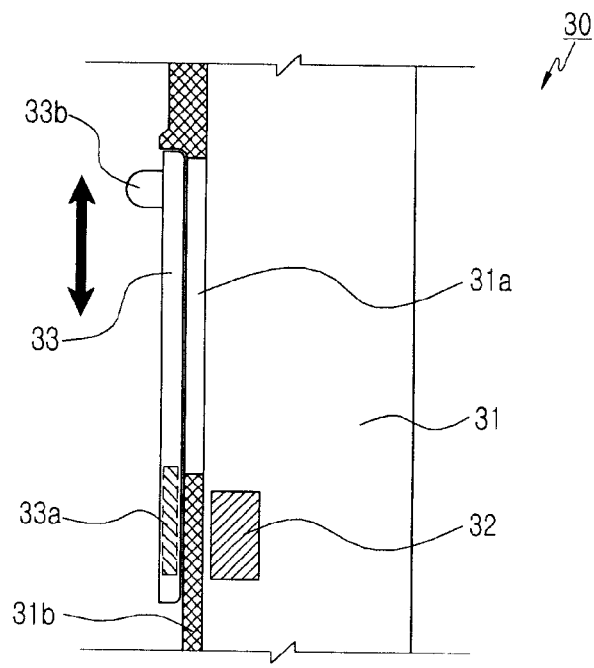
FIG. 18 is a plan view illustrating an assembly state of a cover system for a portable communication device according to a third embodiment of the present invention.
Figure 19:
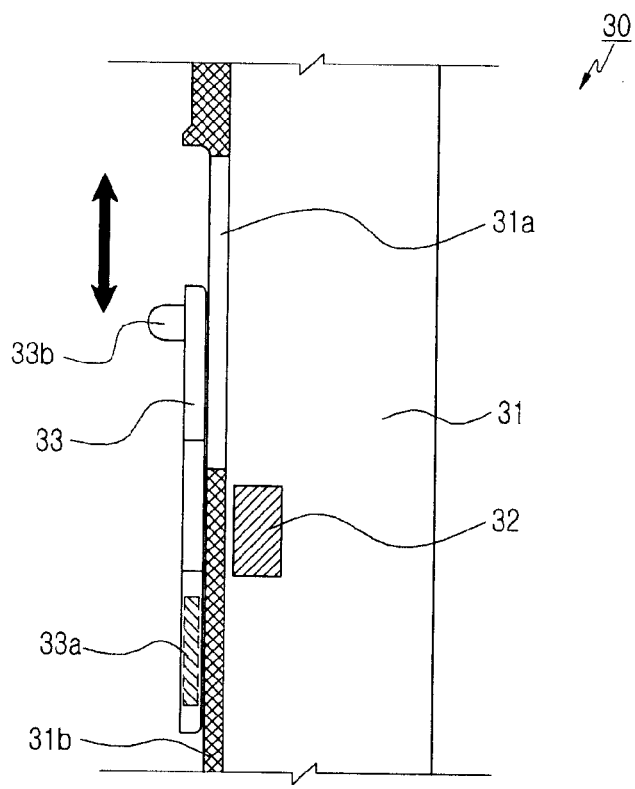
FIG. 19 is a plan view illustrating an operation state of a cover system for a portable communication device according to a third embodiment of the present invention.
Figure 20:
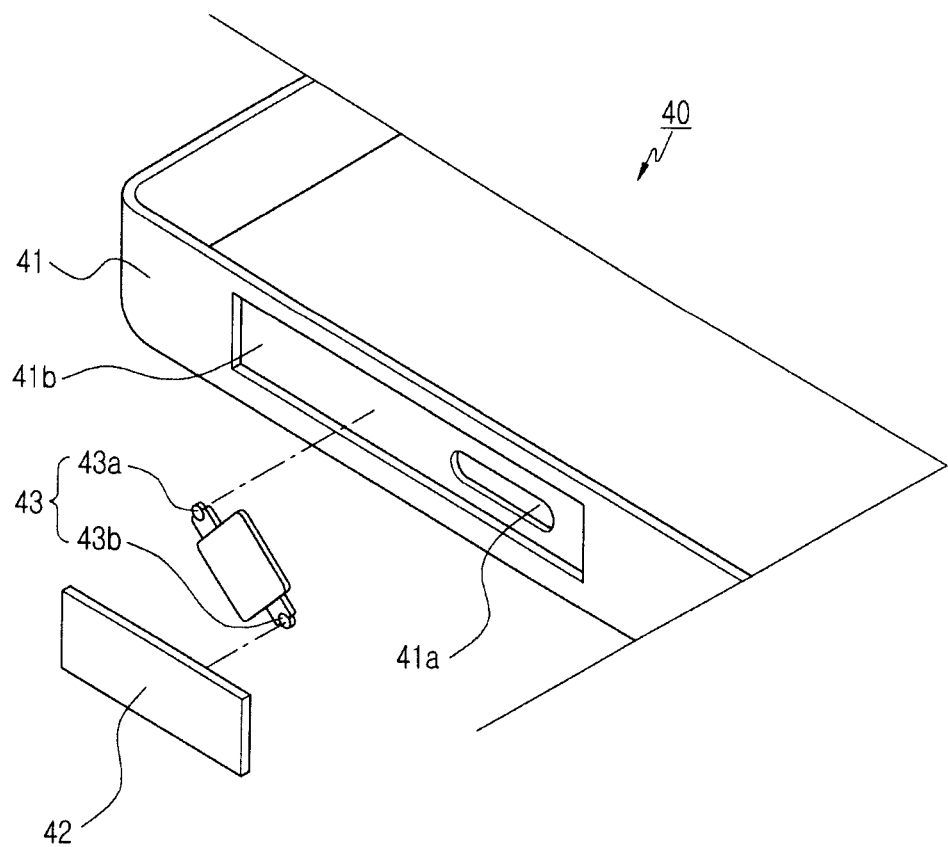
FIG. 20 is an exploded perspective view illustrating the construction of a cover system for a portable communication device according to a fourth embodiment of the present invention.

As shown in FIGS. 17 to 19, a cover system 30 for the portable communication device includes a body 31 of the portable communication device, a slot entrance 31a formed on the body 31, and a cover unit 33 embedding a first magnet 32 and a second magnet 33a.

The slot entrance 31 is formed on the body 31 and assembled with the cover unit 33.

The first magnet 32 is formed on a location adjacent to the slot entrance to correspond to the second magnet 33a.

The cover unit 33 slidably assembled with the slot entrance 31a so as to open/close the slot entrance 31a by a magnetic force of the first and second magnets 32 and 33a when sliding occurs.

The second magnet 33a is built-in in the cover unit 33 via a dual injection process.

The body 31 includes a guide rail 31b so as to guide the sliding of the cover unit 33. A knob 33b protrudes from an external surface of the cover unit 33.

In this state, as shown in FIG. 19, if the user wishes to open the cover unit 33 from the slot entrance 31a, the user contacts and slides the knob 33b formed on the cover unit 33.

At this time, the second magnet 33a built in the cover unit 33 also slides, the second magnet 33a recedes from the first magnet 32 and escapes from the magnetic force of the first and second magnets 32 and 33a so that the magnetic force of the first and second magnets 32 and 33a is no longer influenced.

The cover unit 33 slides along the guide rail 31b formed on the body 3, thus exposing the slot entrance 31a.

As shown in FIG. 18, if the user contacts and slides the knob 33b of the cover unit 33 so as to close the slot entrance 31a, the cover unit 33 is guided to move along the guide rail 31b formed on the body 31, and if the second magnet 33a of the cover unit 33 moves to a location adjacent to the first magnet 32, the first and second magnets 32 and 33a pull each other by the magnetic force thereof so that the first magnet 32 corresponds to the second magnet 33a, thus closing the slot entrance 31a.

Hereinafter, the operation of a cover system for the portable communication device according to a fourth embodiment of the present invention will be described with reference to FIGS. 20 to 23 in more detail.

As shown in FIGS. 20 to 23, a cover system 40 for the portable communication device includes a body 41 of the portable communication device, a slot entrance 41a formed on the body 41, a cover unit 42, and an elastic member 43.

The slot entrance 41a is formed on the body 41 and assembled with the cover unit 42.

The cover unit 42 is slidably assembled with the slot entrance 41a so that the cover unit 42 semi-automatically slides by the elastic force of the elastic member to open/close the slot entrance 41a.

The elastic member 43 is formed between the body 41 and the cover unit 42 so as to provide the elastic force for semi-automatically sliding the cover unit 42.

The body 41 includes a movement space 41b for sliding the cover unit 42.

One end 43a of the elastic member 43 is fastened with the body 41 and the other end 43b of the elastic member 43 is fastened with the cover unit 42.

The elastic member 43 is made of a push rod, but is not limited thereto and can be made of other materials, e.g. a coil spring.

Figure 21:
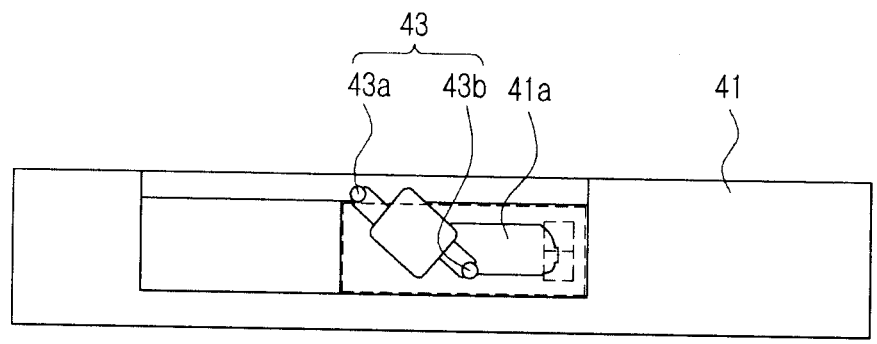
FIG. 21 is an elevational view illustrating the state prior to operating a cover opening/closing apparatus for a portable communication device according to a fourth embodiment of the present invention.
Figure 22:
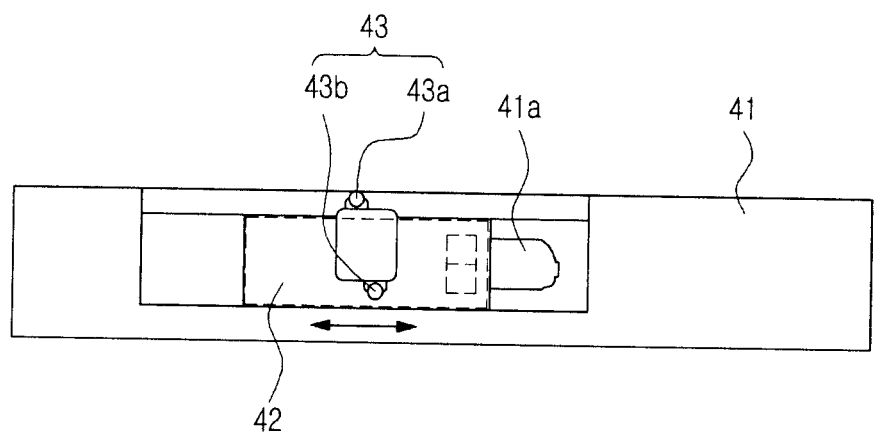
FIG. 22 is an elevational view illustrating an operation procedure of a cover system for a portable communication device according to a fourth embodiment of the present invention.

As shown in FIGS. 21 and 22, if the user wishes to open the cover unit 42 from the slot entrance 41, the user first contacts and slides the cover unit 42.

At this time, the elastic member 43 also slides and rotates which in turn causes both ends 43a and 43b of the elastic member 43 to be compressed.

Here, if the cover unit 42 moves from an initial location of the sliding to a middle location, both ends 43a and 43b of the elastic member 43 are compressed. If the cover unit 42 moves beyond the middle location of the sliding, the elastic member 43 also rotates and moves and the compressed ends 43a and 43b of the elastic member 43 are tensioned to provide the elastic force so that the cover unit 42 slides semi-automatically.

The cover unit 42 moves to a finish location of the sliding by the elastic force of the elastic member 43 to open the slot entrance 41a.

Figure 23:
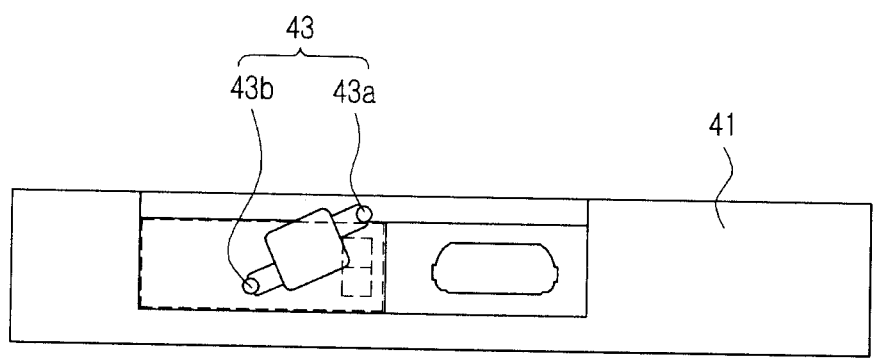
FIG. 23 is an elevational view illustrating the state after operating a cover system for a portable communication device according to a fourth embodiment of the present invention.

As shown in FIGS. 22 and 23, if the user reversely slides the cover unit 42 so as to close the slot entrance 41a, the cover unit 42 moves from the open position to the middle location of the sliding where both ends 43a and 43b of the elastic member 43 are compressed again.

If the cover unit 42 moves from the middle location of the sliding to the initial location of the sliding again, the compressed ends 43a and 43b of the elastic member 43 are tensioned to provide the elastic force so that the cover unit 42 semi-automatically slides to return to an original location, thus closing the slot entrance 41a.

Accordingly, the elastic member 43 is selectively compressed and tensioned according to the sliding of the cover unit 42 so that the cover unit 42 slides semi-automatically during operation.

While the present invention has been shown and described with reference to certain exemplary embodiments and drawings thereof, it will be understood by those skilled in the art that various changes in form and details may be made therein without departing from the spirit and scope of the invention as defined by the appended claims.

What is claimed is:

1. A cover system for a portable communication device, comprising:
   a slot entrance formed on a body of the portable communication device;
   a cover unit for opening and closing the slot entrance;
   a pair of assembly units, each assembly unit comprising a first groove and a second groove that is smaller than the first groove, the first groove being formed on the slot entrance and the second groove being formed at a location adjacent to the slot entrance; and
   a pair of latching units formed on the cover unit and protruding from a first end and a second end of a back side of the cover unit, wherein each of the latching units is inserted in a different one of the assembly units, so that: (i) when the slot entrance is open, the latching unit is latched into the second groove and (ii) when the cover unit is closed, the latching unit is separated from the second groove and inserted into the first groove.

2. The cover system as claimed in claim 1, wherein each of the latching units comprises an anti-separation jaw so as to prevent the latching unit from being separated from the latching unit's respective assembly unit.

3. The cover system as claimed in claim 1, wherein the cover unit is made of a shape memory alloy or rubber material so that the cover unit is easily opened and closed when an external connection terminal is inserted into and separated from the slot entrance.

* * * * *